(12) United States Patent
Kimura et al.

(10) Patent No.: US 10,177,205 B2
(45) Date of Patent: Jan. 8, 2019

(54) DISPLAY DEVICE HAVING A BANK AND METHOD FOR MANUFACTURING DISPLAY DEVICE HAVING A BANK

(71) Applicant: Japan Display Inc., Tokyo (JP)

(72) Inventors: Yasukazu Kimura, Tokyo (JP); Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/276,853

(22) Filed: Sep. 27, 2016

(65) Prior Publication Data

US 2017/0117337 A1 Apr. 27, 2017

(30) Foreign Application Priority Data

Oct. 23, 2015 (JP) ................. 2015-208714

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 51/5203* (2013.01); *H01L 51/5246* (2013.01); *H01L 51/56* (2013.01); *H01L 27/3218* (2013.01); *H01L 2227/323* (2013.01)

(58) Field of Classification Search
CPC ............. H01L 27/3246; H01L 51/5203; H01L 51/5246; H01L 27/5203
See application file for complete search history.

(56) References Cited

U.S. PATENT DOCUMENTS

| 2008/0001535 | A1* | 1/2008 | Kim | ................... H01L 27/3246 313/505 |
| 2009/0215350 | A1* | 8/2009 | Takei | ................. H01L 27/3246 445/23 |
| 2011/0298775 | A1* | 12/2011 | Mori | ................... G09G 3/3225 345/211 |
| 2013/0248867 | A1* | 9/2013 | Kim | ................... H01L 51/5253 257/59 |
| 2016/0141341 | A1 | 5/2016 | Kajiyama et al. | |

FOREIGN PATENT DOCUMENTS

| JP | 2000-215989 | * | 8/2000 | ............. H05B 33/22 |
| JP | 2000215989 | A * | 8/2000 | |
| JP | 2006-294454 | * | 10/2006 | ............. H01L 51/50 |
| JP | 2012-018386 | A | 1/2012 | |
| JP | 2016-095971 | A | 5/2016 | |

* cited by examiner

*Primary Examiner* — Matthew Landau
*Assistant Examiner* — Mark Hatzilambrou
(74) *Attorney, Agent, or Firm* — Typha IP LLC

(57) ABSTRACT

A display device including a plurality of first electrodes arranged in a display region above a substrate, each of the plurality of first electrodes being in common with n (n is an integer of 2 or more) number of light emitting elements, a bank having a recess part and partitioning the n number of light emitting elements with the recess part as a boundary in each of the plurality of first electrodes, a light emitting layer arranged above the plurality of first electrodes throughout the display region, and n groups of second electrodes arranged above the light emitting layer and electrically separated with the recess part as a boundary.

5 Claims, 24 Drawing Sheets

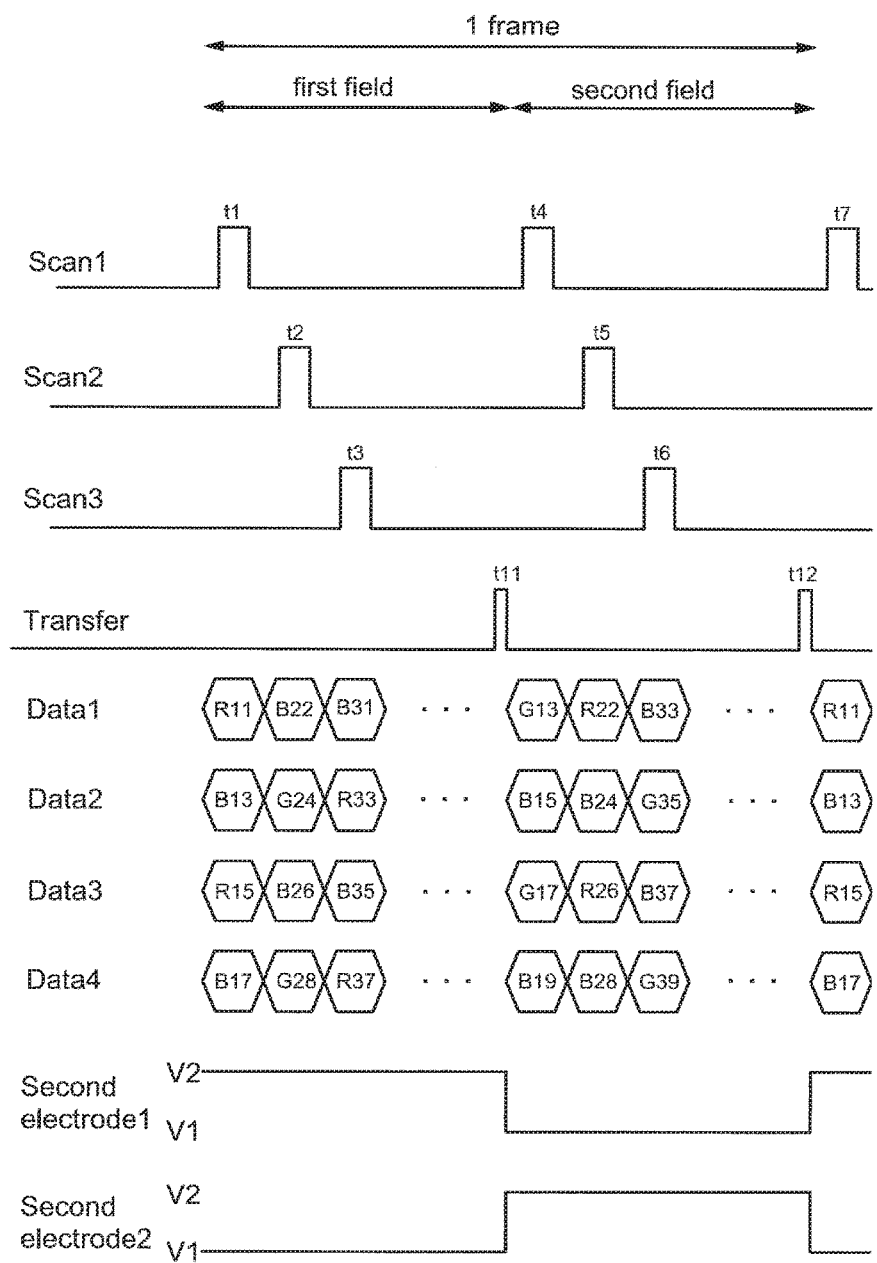

DISPLAY DEVICE HAVING A BANK AND METHOD FOR MANUFACTURING DISPLAY DEVICE HAVING A BANK

CROSS-REFERENCE TO RELATED APPLICATIONS

This application is based upon and claims the benefit of priority from the prior Japanese Patent Application No. 2015-208714, filed on Oct. 23, 2015, the entire contents of which are incorporated herein by reference.

FIELD

The present invention is related to a display device and a method of manufacturing the display device. In particular, the present invention is related to a structure of a pixel in a display device and a method of manufacturing the pixel.

BACKGROUND

An organic electroluminescence (referred to herein as organic EL) display device is arranged with a light-emitting element in each pixel and displays an image by individually controlling the emitted light. A light-emitting element includes a structure in which a layer (referred to herein as [light emitting layer]) including an organic EL material is sandwiched between a pair of electrodes distinguished as an anode and cathode. When electrons are injected from the cathode and holes are injected from the anode, the electrons and hole recombine in the light emitting layer. In this way, light emitting molecules within the light emitting layer are excited by the discharge of surplus energy and following this light is emitted due to de-excitation.

In the organic EL display device, an anode in each light emitting element is arranged as a pixel electrode in each pixel and a cathode is arranged as a common electrode which bridges a plurality of pixels and is applied with a common voltage. The organic EL display device controls the emitted light by applying the voltage of the pixel electrode to each pixel with respect to the voltage of the common electrode.

In recent years, high definition of organic EL display devices is progressing. When pixels are simply miniaturized in order to achieve high definition, the area of a contact hole part arranged in each pixel can no longer be ignored and a problem of arises where it is difficult to keep high aperture ratio. Furthermore, pixel circuits which must be arranged within a single pixel also receive the limitations of transistor numbers and design size due to a reduction in area.

In order to solve these problems, a method is disclosed in Japanese Laid Open Patent Publication No. 2012-018386 for example, in which contact holes and drive transistors are shared by making an anode electrode common between a plurality of sub-pixels, and driving by a field sequential method.

In such a display device, the anode electrode is made common between a plurality of light emitting elements and the cathode is divided and driven. In a manufacturing process of a divided cathode type display device, the cathode is formed by an evaporation method and the like using a mask. However, when the structure of a pixel in a display device becomes miniature and complex, it becomes difficult to form fine slits using one mask. Thus, when a plurality of masks is used, there is a possibility that yield may drop due to the alignment precision of each mask. As a result, there was a limit to achieving high-luminosity and high definition even in a divided cathode type display device.

SUMMARY

One aspect of the display device according to the present invention includes a plurality of first electrodes arranged in a display region above a substrate, each of the plurality of first electrodes being in common with n (n is an integer of 2 or more) number of light emitting elements, a bank having a recess part and partitioning the n number of light emitting elements with the recess part as a boundary in each of the plurality of first electrodes, a light emitting layer arranged above the plurality of first electrodes throughout the display region, and n groups of second electrodes arranged above the light emitting layer and electrically separated with the recess part as a boundary.

One aspect of a manufacturing method of the display device according to the present invention includes forming a plurality of first electrodes in a display region arranged above a substrate, each of the plurality of first electrodes being in common with n (n is an integer of 2 or more) number of light emitting elements, forming a bank partitioning the n number of light emitting elements in each of the plurality of first electrodes, forming a recess part in the top of the bank and along top of the bank, forming a light emitting layer group being mutually separated with the recess part as a boundary simultaneously with depositing a light emitting layer throughout the display region and forming a light emitting layer, and forming n groups of second electrodes mutually and electrically separated with the recess part as a boundary simultaneously with depositing a conductive layer throughout the display region.

One aspect of a manufacturing method of the display device according to the present invention includes forming a plurality of first electrodes arranged in a display region above a substrate, each of the first electrodes being in common with n (n is an integer of 2 or more) number of light emitting elements, forming a bank partitioning the n number of light emitting elements in each of the plurality of first electrodes, forming a light emitting layer throughout the display region, forming a conductive layer throughout the display region above the light emitting layer; and forming n groups of second electrodes mutually and electrically separated with the recess part as a boundary simultaneously with depositing a recess part in the top of the bank and along the bank and passing through the conductive layer and the light emitting layer.

BRIEF DESCRIPTION OF DRAWINGS

FIG. 13 is a timing chart for explaining a driving method of a display device related to one embodiment of the present invention.

DESCRIPTION OF EMBODIMENTS

The embodiments of the present invention are explained below while referring to the diagrams. However, it is possible to perform the present invention using various different forms, and the present invention should not be limited to the content described in the embodiments exemplified herein. Although the width, thickness and shape of each component are shown schematically compared to their actual form in order to better clarify explanation, the drawings are merely an example and should not limit an interpretation of the present invention. In addition, in the specification and each drawing, the same reference symbols are attached to similar elements and elements that have been mentioned in previous drawings, and therefore a detailed explanation may be omitted where appropriate.

First Embodiment

The structure, driving method and manufacturing method of a display device 100 related to the present embodiment is explained using the diagrams.

[Structure]

Figure 1:
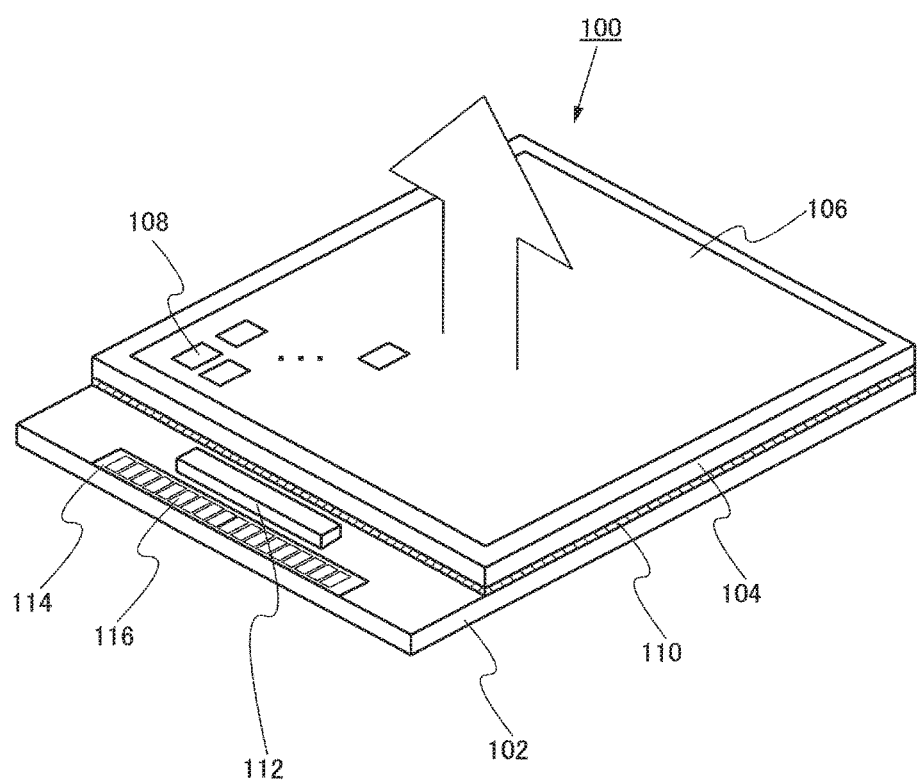
FIG. 1 is a perspective view diagram for explaining a structure of a display device related to one embodiment of the present invention.

FIG. 1 is a perspective view diagram showing a schematic structure of a display device 100 related to the present embodiment. The display device 100 related to the present embodiment includes a first substrate 102, a second substrate 104, a plurality of pixels 108, a sealing member 110, a terminal region 114 and a connection terminal 116.

A display region 106 is arranged on the first substrate 102. The display region 106 is configured by arranging the plurality of pixels 108. The second substrate 104 is arranged opposing the first substrate 102 in the upper surface of the display region 106. The second substrate 104 is fixed to the first substrate 102 by the sealing member 110 which encloses the display region 106. The display region 106 formed on the first substrate 102 is sealed by the second substrate 104 and sealing member 110 so as not be exposed to the air. By adopting such a sealing structure, degradation of a light emitting element arranged in a pixel 108 is suppressed.

The terminal region 114 is arranged at one end part of the first substrate 102. The terminal region 114 is arranged on the outer side of the second substrate 104. The terminal region 114 is formed by a plurality of connection terminals 116. A wiring substrate which connects devices which output a video signal or a power source with a display panel (display device 100 in FIG. 1) is arranged in the connection terminal 116. The connection point of the connection terminal 116 which is connected with the wiring substrate is exposed to the exterior. A driver IC 112 which outputs a video signal input from the connection terminal 116 to the display region 106 is arranged on the first substrate 102.

Figure 2:
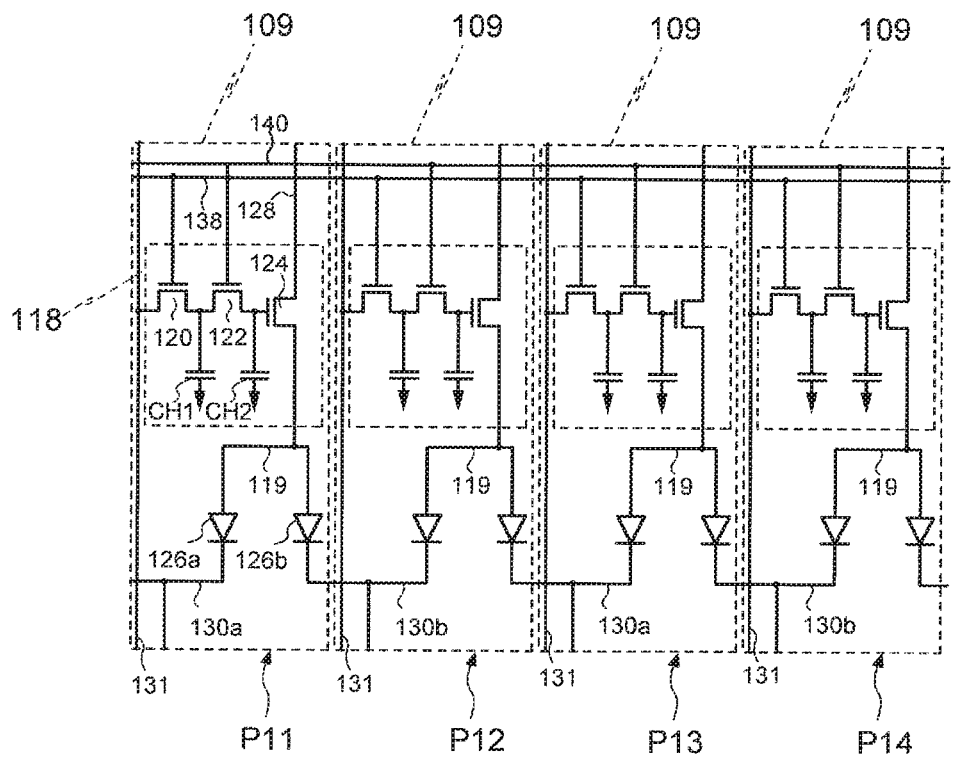
FIG. 2 is a circuit diagram for explaining a pixel circuit of a display device related to one embodiment of the present invention.
Figure 3:
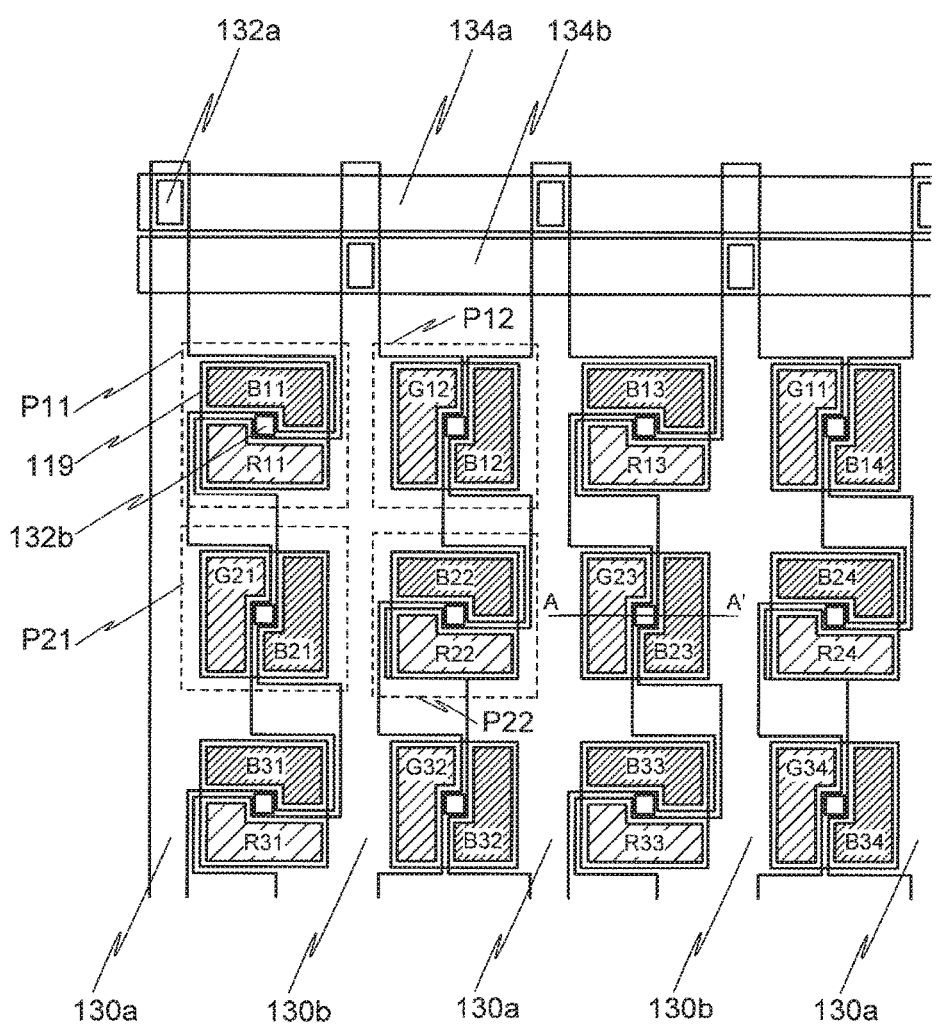
FIG. 3 is an upper surface diagram for explaining a layout of a pixel in a display device related to one embodiment of the present invention.

FIG. 2 is a circuit diagram for explaining a pixel circuit 109 in the display device 100 related to the present embodiment, and FIG. 3 is an upper surface view for explaining a layout of a pixel in the display device 100 related to the present embodiment.

In FIG. 3, numbers are attached to rows and columns in pixel units, Pij is attached to a pixel on row i and column j, and a symbol such as Rij is attached to a sub-pixel which forms the pixel Pij. A red sub-pixel is arranged within a pixel on an odd row and odd column and an even row and even column, and are indicated by the symbols R11, R13, . . . , R22, R24, . . . R31, R33 . . . . A green sub-pixel is arranged within a pixel on an odd row and even column and an even row and odd column, and are indicated by the symbols G11, G14, . . . , G21, G23, . . . G33, G34 . . . . A blue sub-pixel is arranged within all pixels P, and are indicated by the symbols B11, B12, B13, B14 . . . , B21, B22, B23, B24, . . . B31, B32, B33, B34, . . . .

The display device 100 related to the present embodiment includes two sub-pixels which emit light of different colors within one pixel P and the two sub-pixels form a single pixel P. Two sub-pixels within one pixel P share one the first electrode 119. That is, in the present specification, a pixel is defined as a collection of a plurality (two in the present specification) of sub-pixels which share one first electrode 119.

In the example as is shown in FIG. 3, a pixel P11 is formed by a red sub-pixel R11 and blue sub-pixel B11. A pixel P12 adjacent in a row direction to the pixel P11 is formed by a green sub-pixel G12 and blue sub-pixel B12. In addition, a pixel P21 adjacent in a column direction to the pixel P11 is formed by a green sub-pixel G21 and blue sub-pixel B21. Two pixels the same as pixel P11 and pixel P12 are arranged alternately in a row direction. Two pixels the same as pixel P11 and pixel P12 are arranged alternately in a column direction.

As is shown in FIG. 2, the drive circuit 118 has the same structure in each pixel and includes a selection transistor 120, a transmission transistor 122, a drive transistor 124, light emitting elements 126a and 126b, and two storage capacitors CH1 and CH2. A signal of a selection line 138 which selects a pixel in row units is connected to the gate of the selection transistor 120 and controls ON/OFF of the selection transistor. In addition, a signal of a transmission signal line 140 which selects a pixel in row units is connected to the gate of the transmission transistor 120 and controls ON/OFF of the transmission transistor.

The drive transistor 124 in each drive circuit 118 is connected to a current supply line 128 which supplies a drive current of the light emitting elements 126a and 126b and connected to a first electrode 119 of the light emitting elements 126a and 126b. The drive transistor 124 supplies a current to the light emitting elements 126a and 126b. A blue sub-pixel B11 and a red sub-pixel R11 are commonly driven by one drive circuit 118, and a green sub-pixel G12 and a blue sub-pixel B12 are commonly driven by another single drive circuit 118. In the present embodiment, the light emitting element 126a forms a blue sub-pixel B11 and the light emitting element 126b forms a red sub-pixel R11. In addition, a blue sub-pixel B11 and a red sub-pixel R11 form one pixel P11, and a green sub-pixel G12 and a blue sub-pixel B12 form another pixel P12.

A second electrode of the light emitting elements 126a and 126b which form two sub-pixels within a pixel P are each respectively connected to light emitting elements 126a and 126b of a sub-pixel which forms an adjacent pixel P in a row direction. Using FIG. 3, in this example, the second electrodes of a light emitting element which forms a red sub-pixel R11 of the pixel P11 and a light emitting element which forms a green sub-pixel G12 of the adjacent pixel P12 are connected. The second electrodes of a light emitting element which forms a blue sub-pixel B12 of the pixel P12 and a light emitting element which forms a blue sub-pixel B13 of the adjacent pixel P13 are connected.

Furthermore, a second electrode of the light emitting elements 126a and 126b which form two sub-pixels within a pixel P are each respectively connected to light emitting elements 126a and 126b of a sub-pixel which forms an adjacent pixel 108 in a column direction. Using FIG. 3, in this example, the second electrodes of a light emitting element which forms a red sub-pixel R11 of the pixel P11 and a light emitting element which forms a blue sub-pixel B21 of the adjacent pixel P21 are connected. The second electrodes of a light emitting element which forms a green sub-pixel G12 of the pixel P12 and a light emitting element which forms a blue sub-pixel B22 of the adjacent pixel P22 are connected.

Second electrodes which are common between a plurality of light emitting elements have periodicity in a column direction and form the second electrodes 130a and 130b.

The second electrodes 130a and 130b extend to the outside of the display region 106 and are connected to every other common power supply line 134a and 134b via a contact hole 132a. The display device 100 related to the present embodiment includes two common power supply lines (134a and 134b) and a light ON voltage V1 and light OFF voltage V2 are switched and selectively supplied from two second electrodes (not shown in the diagram) of the common power supply lines respectively.

Figure 4:
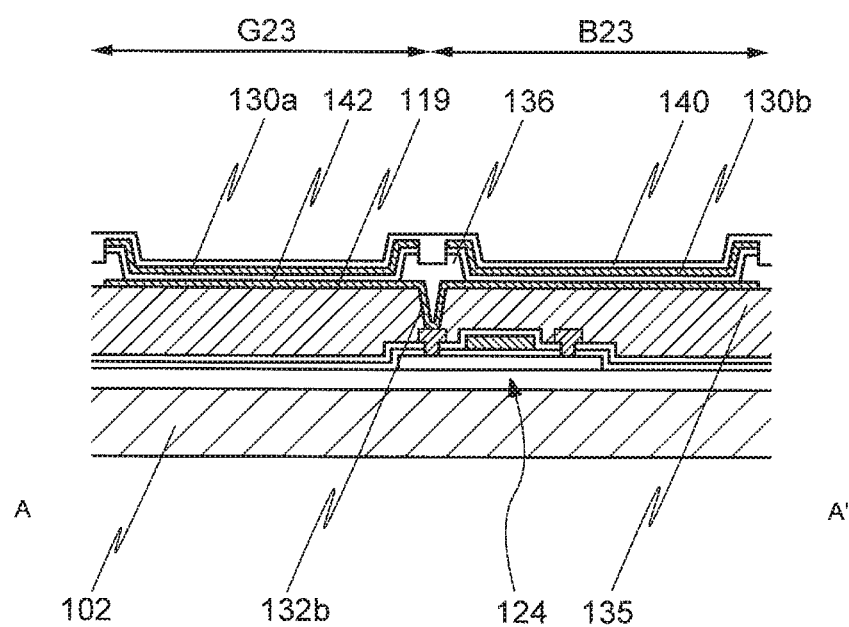
FIG. 4 is a cross-sectional diagram for explaining a structure of a pixel in a display device related to one embodiment of the present invention.

FIG. 4 is a cross-sectional diagram for explaining a schematic structure of a pixel along the line AA' in FIG. 3. The same symbols are attached to the same parts in FIG. 3. In addition, pixel circuit elements other than the drive transistor 124 are omitted.

A green sub-pixel G23 is arranged in a region on the left side enclosed by a bank 136 in the diagram. In addition, a blue sub-pixel B23 is arranged in the right side region. In this way, one sub-pixel is arranged in one region enclosed by the bank 136.

Each light emitting element which forms a blue sub-pixel B23 and green sub-pixel G23 respectively has a common first electrode 119 and is driven by one drive transistor 124. The first electrode 119 and a source electrode of the drive transistor 124 are electrically connected via a contact hole 132b. In addition, the second electrodes 130a and 130b each of which form a sub-pixel in one pixel P are formed separated by the bank 136 as a boundary.

Figure 5:
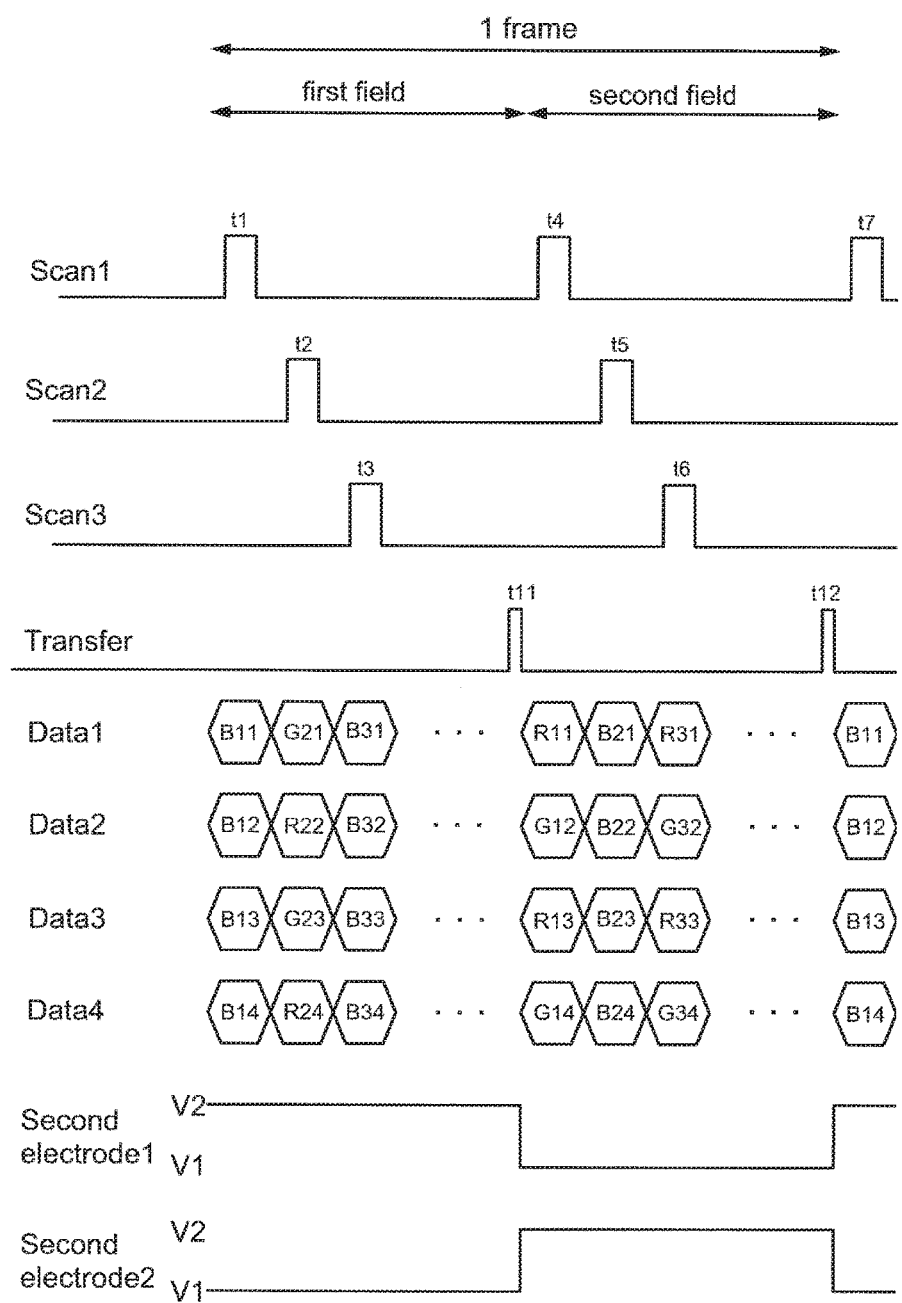
FIG. 5 is a timing chart for explaining a driving method of a display device related to one embodiment of the present invention.

A driving method of the display device 100 related to the present embodiment is explained using FIG. 5. FIG. 5 is a timing chart for explaining a driving method of the display device 100 related to the present embodiment. Scan1, Scan2 and Scan3 represent a voltage pulse applied to a selection line 138, Transfer represents a voltage pulse applied to a transmission signal line 140, Data1-Data4 represents a data signal of a data line 131, Second electrode1 represents a voltage of a second electrode 130a and Second electrode2 represents a voltage of a second electrode 130b.

One frame is divided into a first half first field and second half second field.

Signals Scan1, Scan2 are applied to a selection line 138 on each row in the first field, and a selection voltage (High Level) is supplied in sequence to a gate electrode of the selection transistor 120 one row at a time. Scan1 which is applied to the selection line 138 on the first row plays a role of the selection voltage in a time period t1, and a data signal (Data1-4) of the data line 131 is transmitted to a first stage storage capacitor CH1 of the pixel circuit 109. The second row is selected in a time period t2, and the third row is selected in a time period t3, the same operations are repeated in sequence, and a data signal is written to a pixel circuit 109 on all rows.

Next, a signal Transfer of a transmission signal line 140 on all rows become a High Level at once in the time period t11, and the transmission transistor 122 of the drive circuit 118 becomes an ON state. In this way, the voltage of the first stage storage capacitor CH1 is transmitted to a second stage storage capacitor CH2. The voltage stored in the second stage storage capacitor CH2 continues to be applied to the gate of the drive transistor 124 even after a transmission signal line 140 returns to a Low Level.

A light ON voltage V1 is applied to a first common power supply line 134a (Second electrode1) and a light OFF V2 is applied to a second common power supply line 134b (Second electrode2) in the second field after the time period t11 is completed. A light emitting element with the second electrode 130a connected to the first common power supply line 134a (Second electrode1) becomes a reverse direction bias state, a current does not flow and light is not emitted. A light emitting element with the second electrode 130b connected to the second common power supply line 134b (Second electrode2) becomes a forward direction bias state, a current flows and light is emitted. Therefore, during the light emitting period in the second field, only one among the two light emitting elements in each sub-pixel is in a light ON state and the other light emitting element is in a light OFF state.

In the second field, Scan1 and Scan2 play a role of a selection voltage in time period t4 and t5 respectively, lower rows similarly become a selection voltage in sequence and the same writing operation is performed. Next, the transmission signal line 140 becomes a selection voltage (High Level) in the time period t12 and a data signal is transferred to a gate of the drive transistor 124.

In the first field of the next frame after the time period t12 is completed, a light ON voltage V2 is applied to the first common power supply line 134a and a light OFF voltage V1 is applied to the second common power supply line 134b. In this way, a light emitting element which was not in a light ON state during the light emitting time period of the second field in each sub-pixel becomes a light ON state and the light emitting element which was in a light ON state in the second field becomes a light OFF state.

Displaying one frame image is completed in the two fields and a color image averaged in the two fields is visually observed.

A schematic structure and driving method of the display device 100 related to the present embodiment was explained above. The structure of the display device 100 and a manufacturing method of the display device 100 related to present embodiment is explained in further detail below.

Here, it should be noted that the first electrode and the second electrode may correspond to an anode and a cathode, respectively. On the other hand, the first electrode and the second electrode may correspond to a cathode and an anode, respectively.

Figure 6:
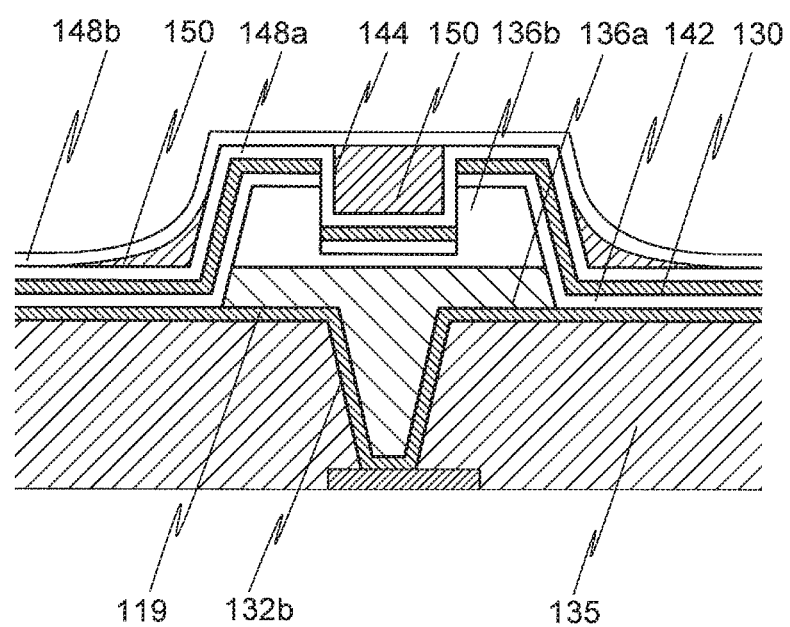
FIG. 6 is a cross-sectional diagram for explaining a structure of a bank periphery of a pixel in a display device related to one embodiment of the present invention.

FIG. 6 is a cross-sectional diagram of the periphery of the bank 136 in the display device 100 related to the present invention.

A first electrode 119 is arranged in the display region 106 above the first substrate 102 and each first electrode 119 is common to n (n is an integer of 2 or more) number of light emitting elements. Furthermore, although n is 2 in the present embodiment, it is possible to expand to the case where n is 3 or more in a similar way as the case where n is 2.

The bank 136 includes a recess part 144 and n number of light emitting elements are partitioned by the recess part 144 as a boundary in each of a plurality of first electrodes 119. In this example, a contact hole 132b is arranged below a recess part 144 of the bank 136. In this way, since the contact hole 132b within one pixel does not restrict the area of a light emitting region, it is possible to provide a high luminosity display device 100.

Here, the bank 136 may have a layer structure which includes a stopper layer 136a and an organic insulation layer 136b above the stopper layer 136a.

Here, the stopper layer 136a may also include an inorganic insulation layer.

By adopting such a structure, it is possible to suppress damage to a transistor or wiring and the like arranged below the bank 136 when forming the recess part 144 in a manufacturing process. Furthermore, it is possible to prevent shorts between a second electrode 130 and a first electrode 119. Furthermore, it is sufficient that the stopper layer 136a be arranged at least below the recess part 144 and does not have to be arranged on the entire surface of a bank seen in a plan view.

The light emitting layer 142 is arranged throughout the display region 106 above a plurality of first electrodes 119. In the present embodiment, the light emitting layer 142 is arranged on a bottom part of the recess part 144 without covering a side wall of the recess part 144. That is, the light emitting layer 142 is separated into a plurality of light emitting layers 142 with the recess part 144 as a boundary.

A second electrode 130 is arranged above the light emitting layer 142 and is arranged as n groups of second electrodes 130 electrically separated with the recess part 144 as a boundary. Since the second electrode 130 does not cover a side wall of the recess part 144, the second electrode 130 is arranged as n groups of second electrodes 130 electrically separated with the recess part 144 as a boundary. Furthermore, it is sufficient that the second electrode 130 not cover a side wall of the recess part 144 so that n groups of second electrodes 130 are electrically separated and may also be arranged in a bottom part of the recess part 144 as in the present embodiment.

A first sealing layer 148a may also be further arranged to cover a plurality of first electrodes 119 and the bank 136.

An organic insulation layer 150 may be further arranged in the recess part to planarize a top part of the bank 136. Furthermore, the organic insulation layer 150 may also cover an end part of the bank 136. It is possible to ease non-uniformity caused by the bank 136 using the organic insulation layer 150. An insulation material with high burying properties may be used as the organic insulation layer 150, for example, it is possible to use an acrylic resin or an epoxy resin.

A second sealing layer 148b is further arranged to cover a plurality of first electrodes 119 and the bank 136. Since non-uniformity in a surface covered by the second sealing layer is eased by the organic insulation layer 150, it is possible to suppress the occurrence of a water infiltration path due to non-uniformity caused by the bank 136 or the recess part 144 formed in the bank 136. In this way, it is possible to provide a display device with high resistance to water and high reliability.

The structure of a periphery of the bank 136 of the display device 100 related to the present embodiment was explained in detail above. By providing a structure such as that described above, it is possible to provide a display device with high resistance to water and high reliability.

Here, it should be noted that the first electrode and the second electrode may correspond to an anode and a cathode, respectively. On the other hand, the first electrode and the second electrode may correspond to a cathode and an anode, respectively.

A manufacturing method of the display device 100 related to the present embodiment is explained. FIG. 7A to FIG. 7H are cross-sectional diagrams for explaining a manufacturing method of the display device 100 related to the present embodiment.

Figure 7A:
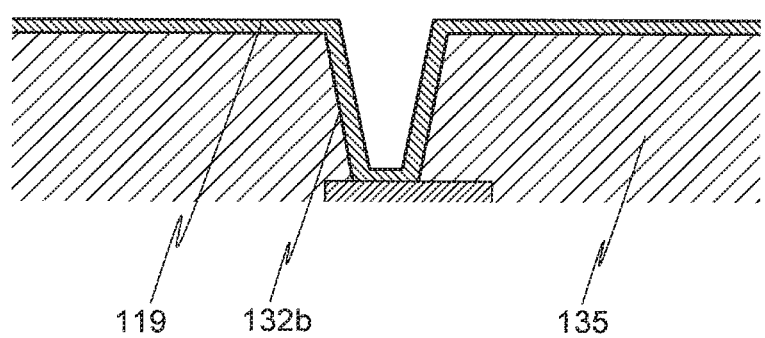
FIG. 7A is a cross-sectional diagram for explaining a manufacturing method of a display device related to one embodiment of the present invention.

First, a plurality of first electrodes 119 are formed in a display region 106 arranged above a first substrate 102 (FIG. 7A). In this example, the plurality of first electrodes 119 are formed above a planarized insulation layer 135 arranged above the first substrate 102. Furthermore, the plurality of first electrodes 119 is electrically connected via a contact hole 132b to a source electrode of a drive transistor 124 (not shown in the diagram) formed below the planarized insulation layer 135.

Each of the plurality of first electrodes 119 is arranged in each pixel P and is common to n (n is an integer of 2 or more) number of light emitting elements. Here, n is 2 in the display device 100 related to the present embodiment.

Since light generated in a light emitting layer 142 is reflected to the second electrode 130 side, the first electrode 119 is preferred to be formed from a metal film with high reflectance. Alternatively, the first electrode 119 may have a stacked layer structure including a light reflective surface comprised of a metal film and transparent conductive film.

Figure 7B:
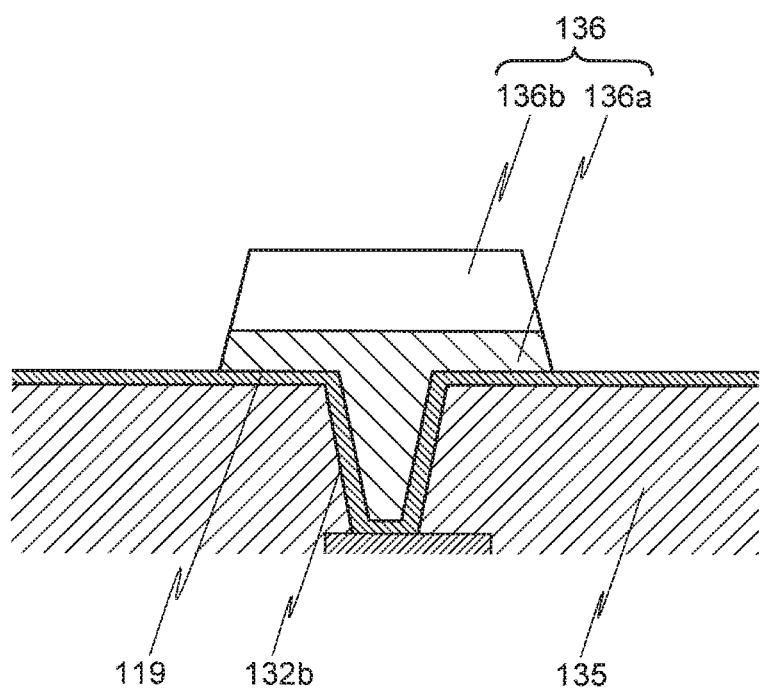
FIG. 7B is a cross-sectional diagram for explaining a manufacturing method of a display device related to one embodiment of the present invention.
Figure 7C:
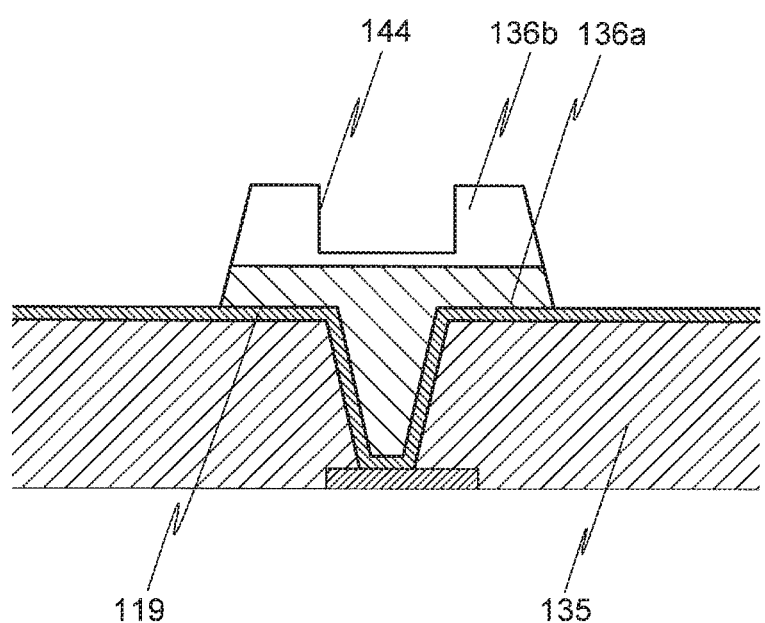
FIG. 7C is a cross-sectional diagram for explaining a manufacturing method of a display device related to one embodiment of the present invention.

Next, a bank 136 which partitions n number of light emitting elements is formed in each of the plurality of first electrodes 119 (FIG. 7B).

One role of the bank 136 is to prevent shorts between the second electrode 130 and the first electrode 119 due to the light emitting layer 142 being insufficiently covering an end part of the first electrode 119 and insulating the space between adjacent pixels P. As a result, it is preferred that the bank 136 is formed using an insulation material. For example, it is preferred that an organic material such as polyimide or acrylic or an inorganic material such as silicon oxide is used when forming the bank 136.

Here, the bank 136 may have a layer structure including a stopper layer 136a and an organic insulation layer 136b above the stopper layer 136a.

Here, the stopper layer 136a may also include an inorganic insulation layer.

By using such as manufacturing method, it is possible to suppress damage to a transistor and the like arranged below a bank 136 in subsequent manufacturing processes. In this way, it is possible to manufacture the display device 100 with a better yield. Furthermore, it is possible to prevent shorts between the second electrode 130 and the first electrode 119.

Next, the recess part 144 is formed in and along top of the bank 136.

Here, the recess part 144 may be formed using a photolithography process.

In addition, the recess part 144 may be formed by evaporating a part of the bank 136 using energy irradiation. For example, laser irradiation may be used as the energy irradiation.

By using such a manufacturing method, it is possible to form the recess part 144 without using of a mask. In this way, a separated second electrode is provided and a manufacturing method of a separately driven display device 100 is simplified.

Figure 7D:
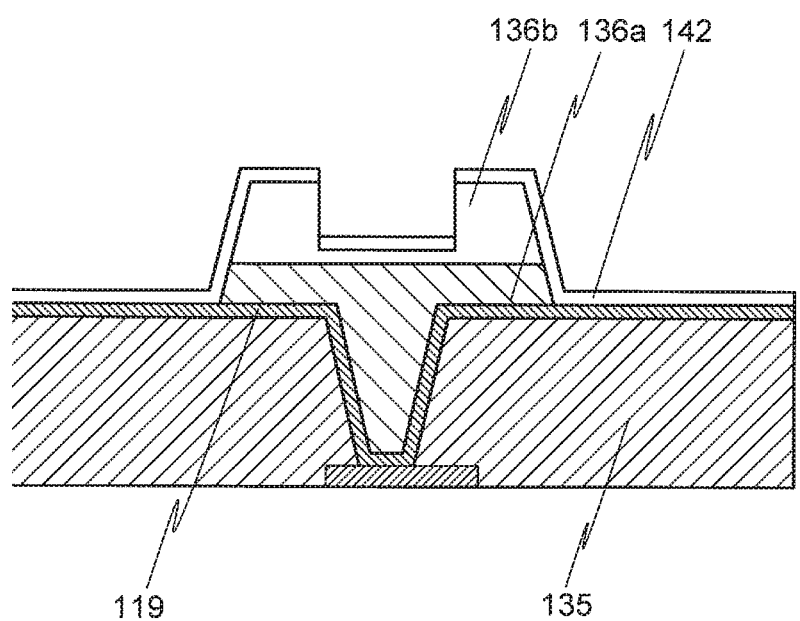
FIG. 7D is a cross-sectional diagram for explaining a manufacturing method of a display device related to one embodiment of the present invention.

Next, the light emitting layer 142 is deposited throughout the display region 106. At the same time as depositing the light emitting layer, a group of the light emitting layers 142 mutually separated with the recess part 144 as a boundary is formed (FIG. 7D). If the depth of the recess part 144 is larger than the film thickness of the light emitting layer 142 and a sidewall of the recess part 144 is processed almost vertically, it is possible to form a step-cut the light emitting layer 142 along the recess part 144.

A low molecular or high molecular organic material is used in the case where the light emitting layer 142 is formed an organic EL layer for example. In the case where a low molecular organic material is used, in addition to the light emitting layer 142 which includes an organic material with light emitting properties, a hole injection layer, an electron injection layer, a hole transport layer and an electron transport layer sandwiching the light emitting layer 142 may also be included.

The light emitting layer 142 uses a material which emits white light and full-color light emitting may be accomplished by using a color filter (not shown in the diagram). In addition, light emitting elements which emit light of each different color may be arranged and correspond to each pixel.

Figure 7E:
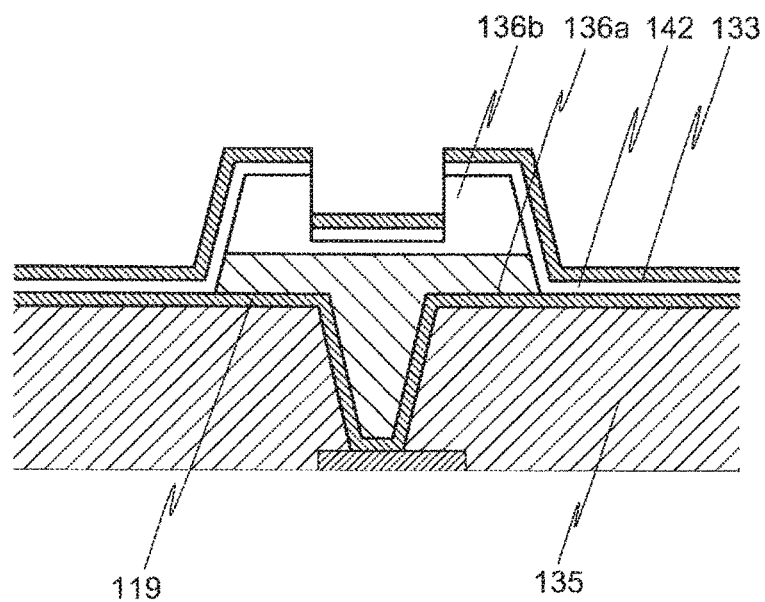
FIG. 7E is a cross-sectional diagram for explaining a manufacturing method of a display device related to one embodiment of the present invention.
Figure 7F:
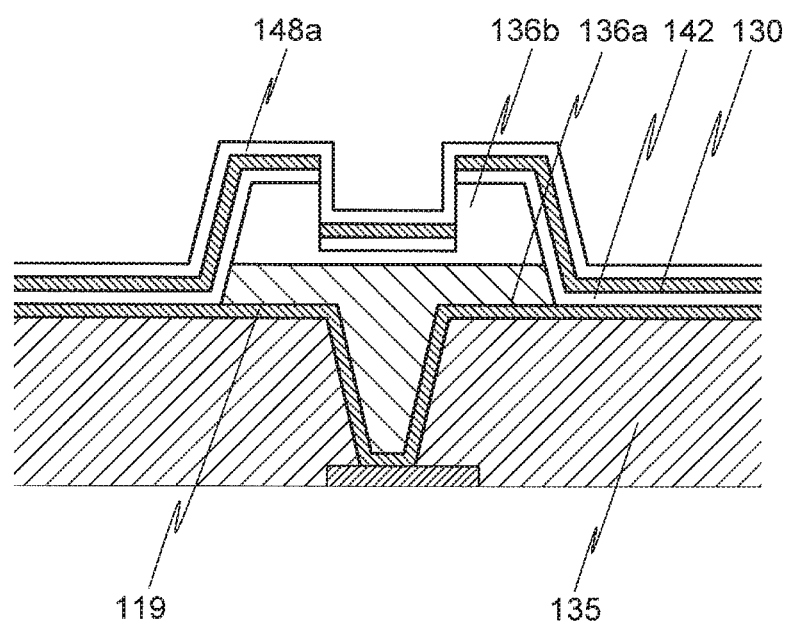
FIG. 7F is a cross-sectional diagram for explaining a manufacturing method of a display device related to one embodiment of the present invention.
Figure 7G:
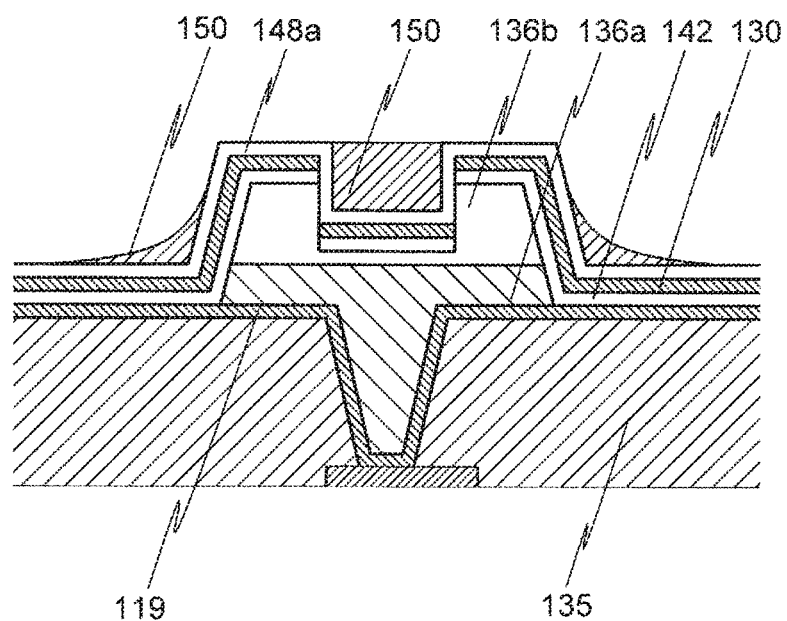
FIG. 7G is a cross-sectional diagram for explaining a manufacturing method of a display device related to one embodiment of the present invention.

Next, a conductive layer 133 is deposited throughout the display region 106. At the same time as depositing the conductive layer 133, n groups of second electrodes 130 mutually electrically separated with the recess part 144 as a boundary are formed (FIG. 7E). If the step of the recess part 144 is large with respect to the film thickness of the conductive layer 133 and a sidewall of the recess part 144 is processed almost vertically, it is possible to step-cut the conductive layer 133 along the recess part 144.

By using such as manufacturing method, it is possible to provide a plurality of separated second electrodes 130 and manufacture a separately driven display device 100 with a better yield.

Since light produced in the light emitting layer 142 passes through the second electrode 130, the second electrode 130 is preferred to be formed by a film having translucency and conductive properties such as ITO (Indium Tin Oxide) or IZO (Indium Zinc Oxide). Alternatively, a metal film may be formed with a thickness which allows emitted light to pass through as the second electrode 130.

Figure 7H:
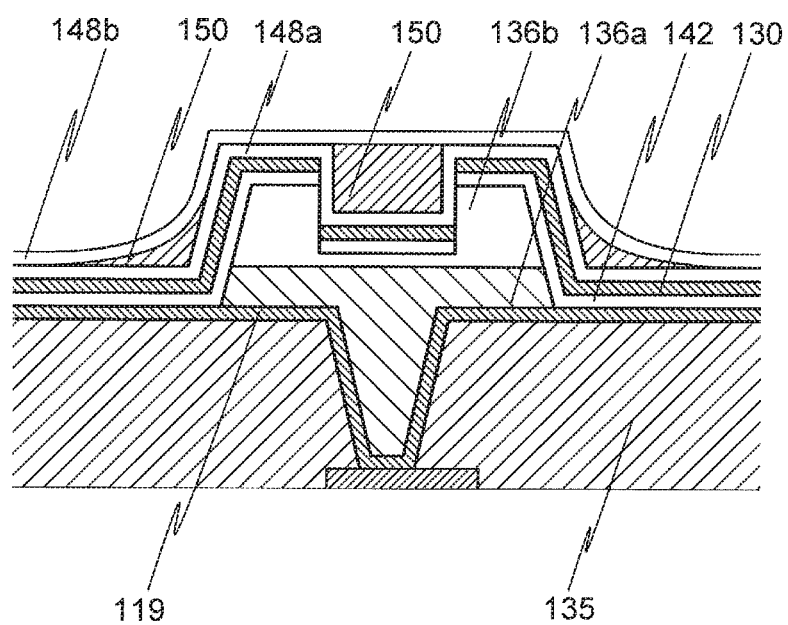
FIG. 7H is a cross-sectional diagram for explaining a manufacturing method of a display device related to one embodiment of the present invention.

Next, a first sealing layer 148a is formed throughout the display region 106 after n groups of second electrodes 130 are formed (FIG. 7F), an acrylic resin 150 for planarizing the surface of the first sealing layer 148a is formed (FIG. 7G), and a second sealing layer 148b may also be formed throughout the display region 106 (FIG. 7H).

By using such a manufacturing method, since coverage of the bank 136 is improved by the second sealing layer 148b, it is possible to suppress the occurrence of a water infiltration path due to non-uniformity caused by a bank 136 and recess part 144 formed in the bank 136. In this way, it is possible to manufacture a display device 100 with high resistance to water and high reliability.

Here, it should be noted that the first electrode and the second electrode may correspond to an anode and a cathode, respectively. On the other hand, the first electrode and the second electrode may correspond to a cathode and an anode, respectively.

Modified Example

A detailed structure and manufacturing method of the display device 100 related to a modified example of the present embodiment is explained using the diagrams.

Figure 8:
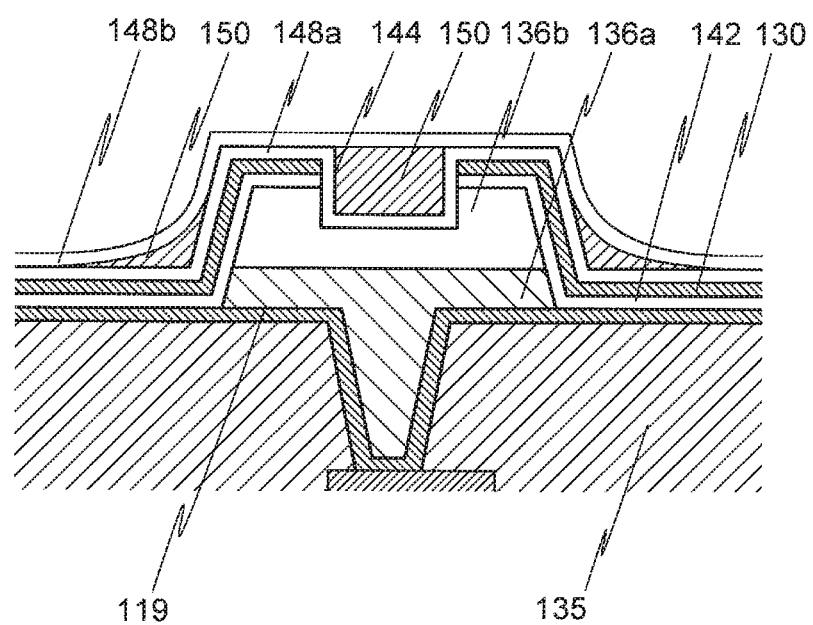
FIG. 8 is a cross-sectional diagram for explaining a structure of a bank periphery of a pixel in a display device related to one embodiment of the present invention.

FIG. 8 is a cross-sectional diagram of the periphery of the bank 136 in the display device 100 related to a modified example of the present embodiment. Compared to the display device 100 related to the present embodiment shown in FIG. 6, the display device related to the present embodiment is different only in that a light emitting layer 142 and second electrode 130 are not arranged in the bottom part of the recess part 144. In this way, the second electrode 130 is arranged as n groups of second electrodes 130 electrically separated with the recess part 144 as a boundary.

Here, it should be noted that the first electrode and the second electrode may correspond to an anode and a cathode, respectively. On the other hand, the first electrode and the second electrode may correspond to a cathode and an anode, respectively.

[Manufacturing Method]

A modified example of a manufacturing method of the display device 100 related to the present embodiment is explained. FIG. 9A to FIG. 9E are cross-sectional diagrams for explaining a modified example of a manufacturing method of the display device 100 related to the present embodiment.

In the present modified example, since the manufacturing method up to the formation of the bank 136 is the same as of the manufacturing method of display device related to the present embodiment previously described, an explanation is omitted.

Figure 9A:
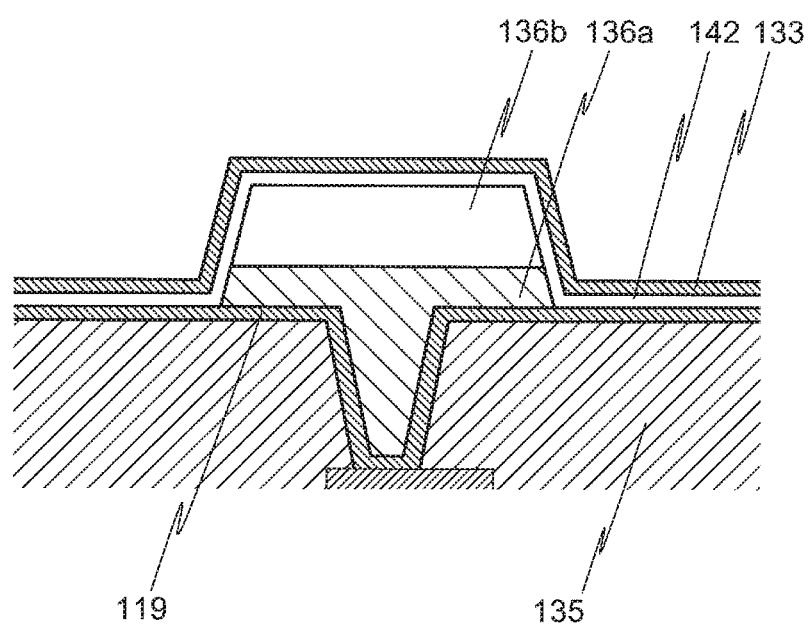
FIG. 9A is a cross-sectional diagram for explaining a manufacturing method of a display device related to one embodiment of the present invention.

After the bank 136 is formed, a light emitting layer 142 is formed throughout the display region 106 and a conductive layer 133 is formed throughout the display region 106 above the light emitting layer 142 (FIG. 9A).

Figure 9B:
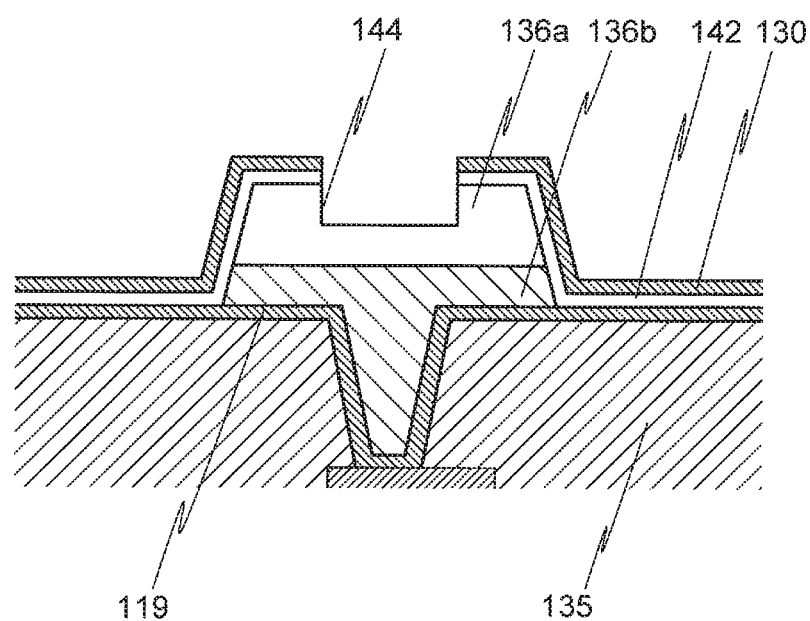
FIG. 9B is a cross-sectional diagram for explaining a manufacturing method of a display device related to one embodiment of the present invention.
Figure 9C:
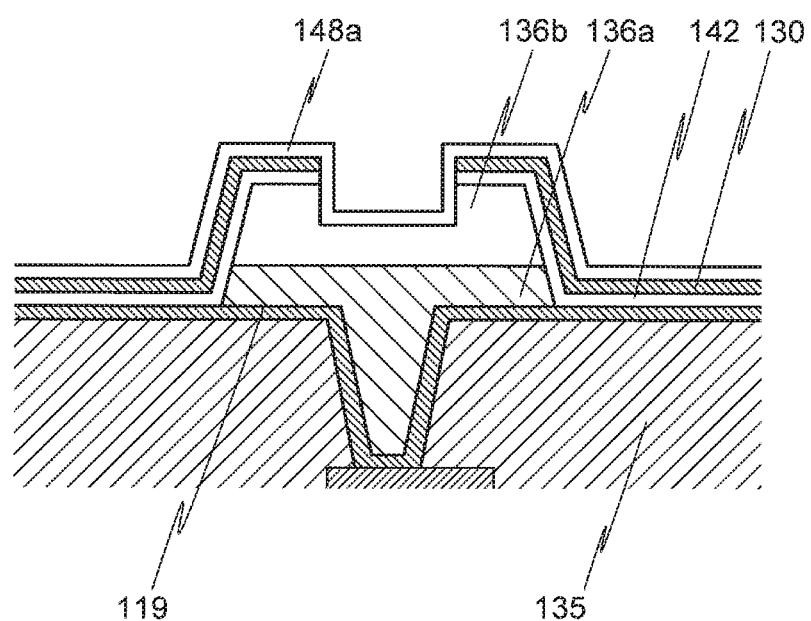
FIG. 9C is a cross-sectional diagram for explaining a manufacturing method of a display device related to one embodiment of the present invention.
Figure 9D:
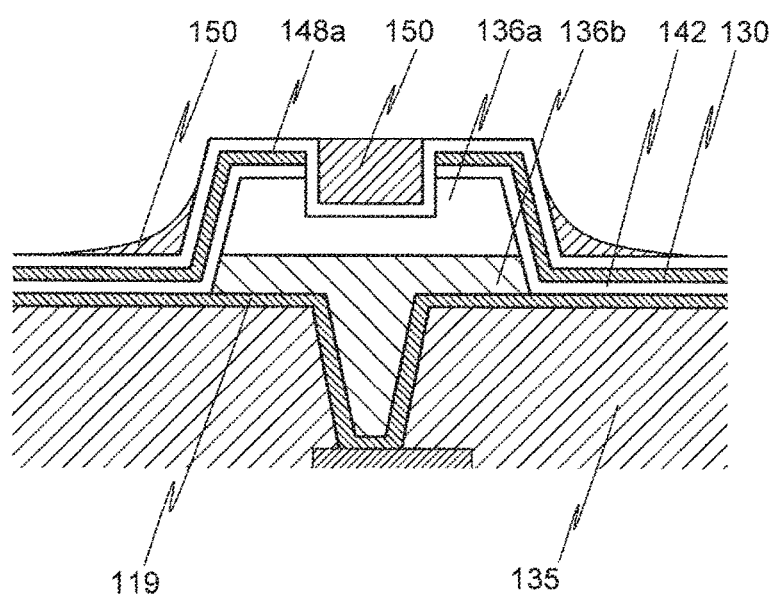
FIG. 9D is a cross-sectional diagram for explaining a manufacturing method of a display device related to one embodiment of the present invention.

Next, the recess part 144 which passes through the conductive layer 133 and light emitting layer 142 is formed above and along the bank 136 (FIG. 9B). At the same time as forming the recess part 144, n groups of second electrodes 130 are formed electrically separated with the recess part 144 as a boundary.

Here, it is possible to form the recess part 144 by sublimation of the conductive layer 133 and light emitting layer 142 using laser irradiation and the like.

By using such a manufacturing method, it is possible to form the recess part 144 without using a mask. In this way, a separated second electrode is provided and a manufacturing method of a separately driven display device 100 is simplified.

Figure 9E:
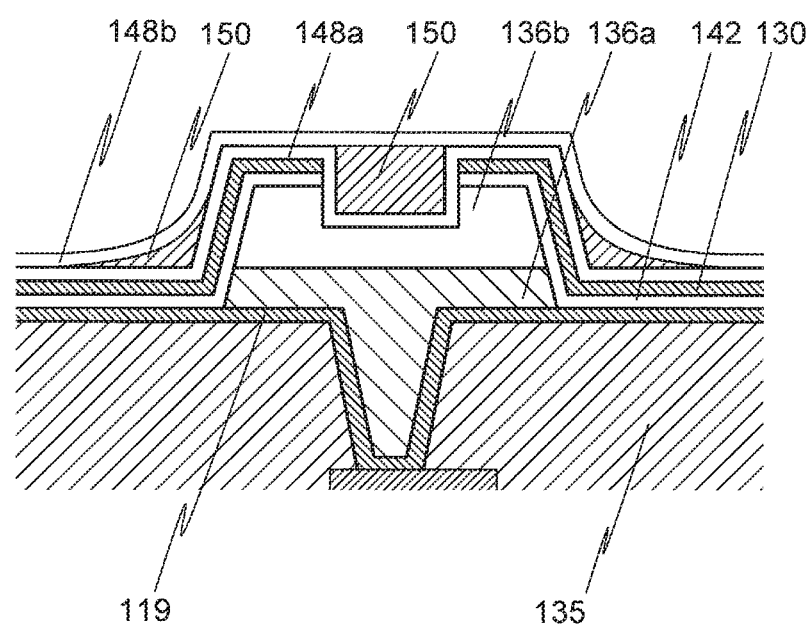
FIG. 9E is a cross-sectional diagram for explaining a manufacturing method of a display device related to one embodiment of the present invention.

Next, a first sealing layer 148a is formed throughout the display region 106 after n groups of second electrodes 130 are formed (FIG. 9C), an acrylic resin 150 for planarizing the surface of the first sealing layer 148a is formed (FIG. 9D), and a second sealing layer 148b may also be formed throughout the display region 106 (FIG. 9E).

By using such a manufacturing method, since coverage of the bank 136 is improved by the second sealing layer 148b, it is possible to suppress the occurrence of a water infiltration path due to non-uniformity caused by a bank 136 and recess part 144 formed in the bank 136. In this way, it is possible to manufacture a display device 100 with high resistance to water and high reliability.

By using such as manufacturing method, it is possible to provide a plurality of separated second electrodes and manufacture a separately driven display device with a better yield.

Second Embodiment

Figure 10:
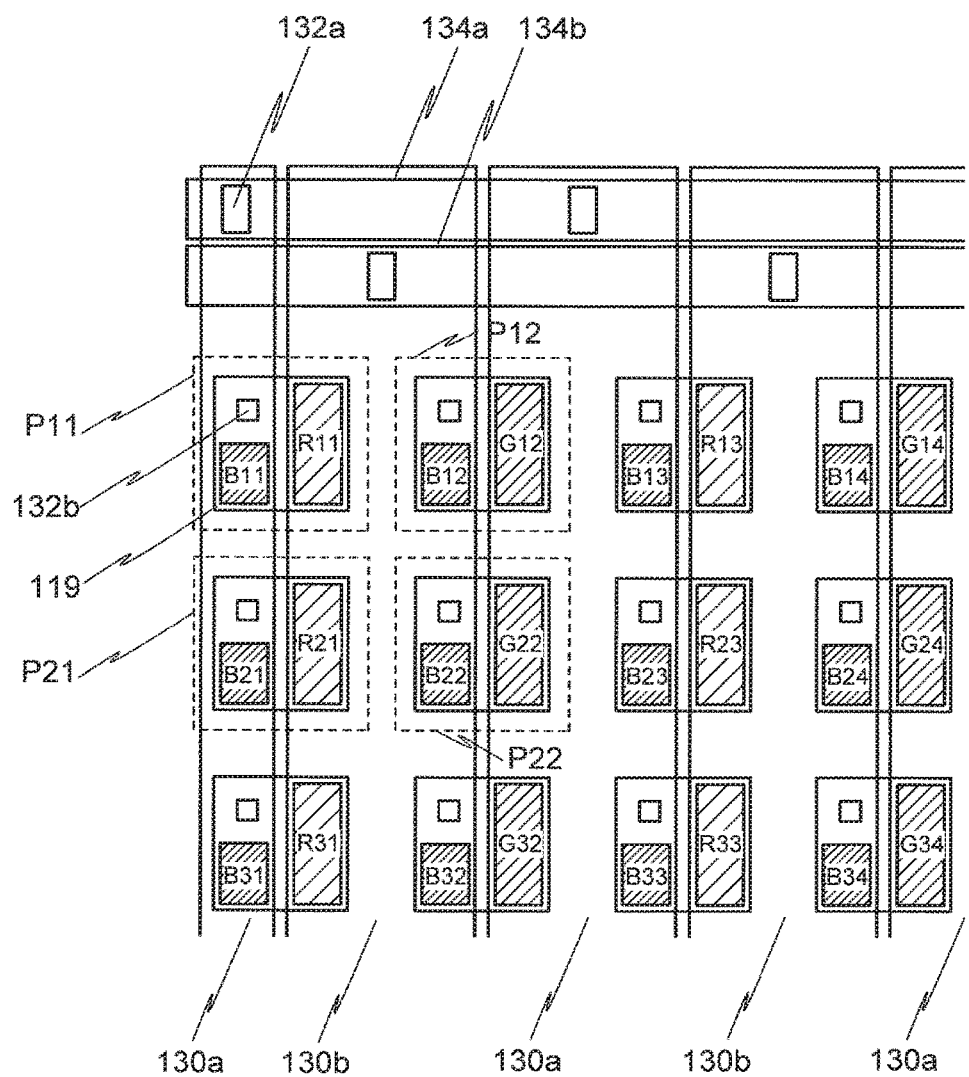
FIG. 10 is an upper surface diagram for explaining a layout of a pixel in a display device related to one embodiment of the present invention.

A structure and driving method of a display device 200 related to the present embodiment is explained using the diagrams. FIG. 10 is an upper surface view diagram for explaining a layout of pixels in the display device 200 related to the present embodiment. Furthermore, the structure of a pixel circuit 109 in the display device 200 related to the present embodiment is the same as the display device 100 related to the first embodiment shown in FIG. 2.

When the display device 200 related to the present embodiment is compared with the display device 100 related to the first embodiment, the layout of the pixels P and second electrode 130 is different. In particular, the layout of the second electrode 130 is simplified and thereby separation of the second electrodes in a manufacturing process becomes easy.

In FIG. 10, numbers are attached to rows and columns in pixel units, Pij is attached to a pixel on row i and column j, and a symbol such as Rij is attached to a sub-pixel which forms the pixel Pij. A red sub-pixel is arranged within a pixel on an odd column and are indicated by the symbols R11, R21, R31 . . . , R13, R23, R33 . . . . A green sub-pixel is arranged within a pixel on an even column, and are indicated by the symbols G11, G22, G32 . . . , G14, G24, G34 . . . . A blue sub-pixel is arranged within all pixels P, and are indicated by the symbols B11, B12, B13, B14 . . . , B21, B22, B23, B24, . . . B31, B32, B33, B34, . . . .

In the example as is shown in FIG. 10, a pixel P11 is formed by a red sub-pixel R11 and blue sub-pixel B11. That is, in a pixel P11 in FIG. 2, the light emitting element 126a forms a red sub-pixel R11 and the light emitting element 126b forms a blue sub-pixel B11. A pixel P12 adjacent in a row direction to the pixel P11 is formed by a green sub-pixel G12 and blue sub-pixel B12. In addition, a pixel P21 adjacent in a column direction to the pixel P11 is formed by a blue sub-pixel B21 and red sub-pixel R21. Two pixels the same as pixel P11 and pixel P12 are arranged alternately in a row direction. Pixels having the same structure as the pixel P11 and pixel P12 are arranged continuously in a column direction.

A second electrode of the light emitting elements 126a and 126b which form two sub-pixels within a pixel P are each respectively connected to light emitting elements 126b and 126a of a sub-pixel which forms an adjacent pixel P in a row direction. In this example, the second electrodes of a light emitting element which forms a red sub-pixel R11 of the pixel P11 and a light emitting element which forms a blue sub-pixel B12 of the adjacent pixel P12 are connected. The second electrodes of a light emitting element which forms a green sub-pixel G12 of the pixel P12 and a light emitting element which forms a blue sub-pixel B13 of the adjacent pixel P13 are connected.

Furthermore, a second electrode of the light emitting elements 126a and 126b which form two sub-pixels within a pixel 108 are each respectively connected to light emitting elements 126a and 126b of a sub-pixel which forms an adjacent pixel 108 in a column direction. In this example, the second electrodes of a light emitting element which forms a red sub-pixel R11 of the pixel P11 and a light emitting element which forms a red sub-pixel R21 of the adjacent pixel P21 are connected. The second electrodes of a light emitting element which forms a green sub-pixel G12 of the pixel P12 and a light emitting element which forms a green sub-pixel G22 of the adjacent pixel P22 are connected.

Second electrodes which are common between a plurality of light emitting elements form the second electrodes 130a and 130b.

The second electrodes 130a and 130b extend to the outside of the display region 106 and are connected to every other common power supply line 134a and 134b via a contact hole 132a. The display device 200 related to the present embodiment includes two common power supply lines and a light ON voltage V1 and light OFF voltage V2 are switched and selectively supplied from two second electrodes (not shown in the diagram) of the common power supply lines respectively.

Figure 11:
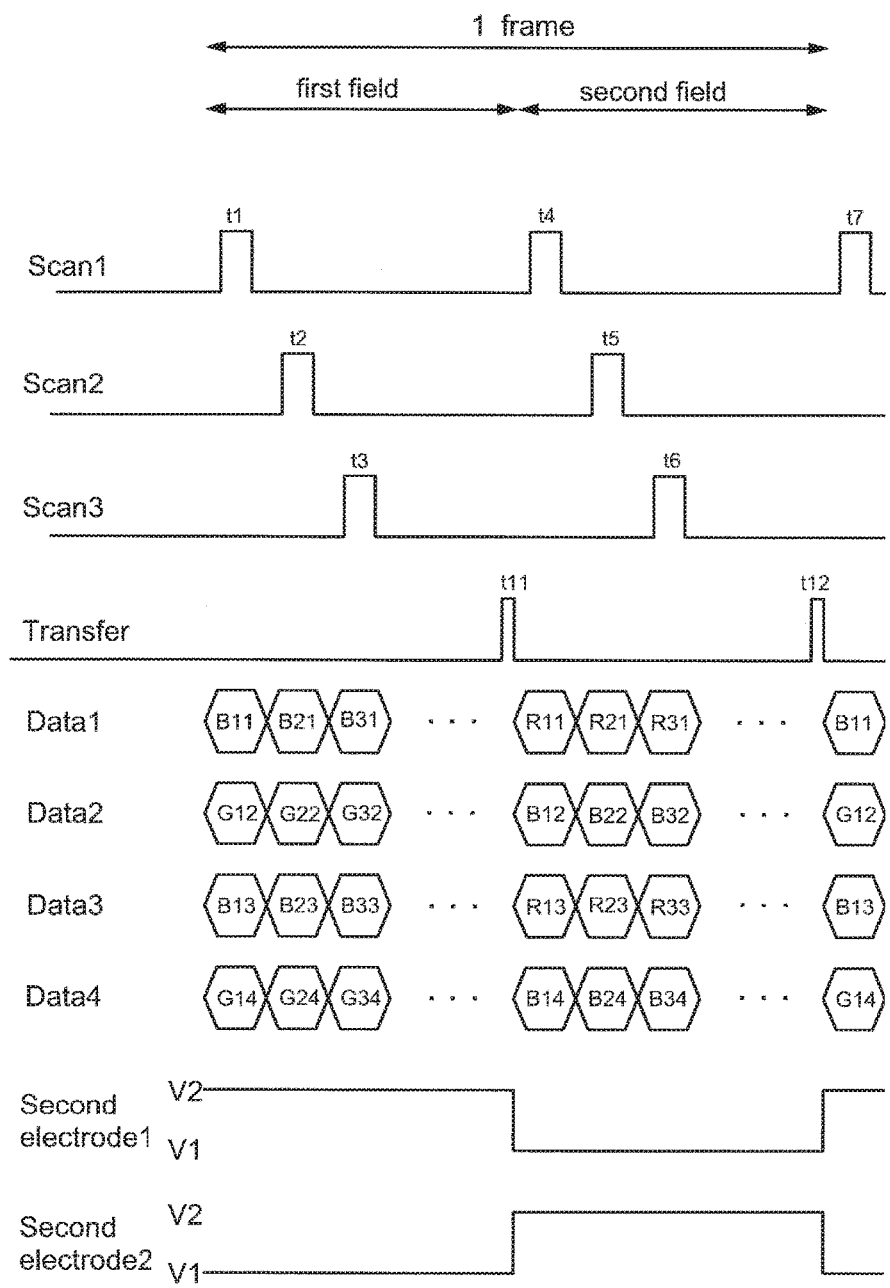
FIG. 11 is a timing chart for explaining a driving method of a display device related to one embodiment of the present invention.

A driving method of the display device 200 related to the present embodiment is explained using FIG. 11. FIG. 11 is a timing chart for explaining a driving method of the display device 200 related to the present embodiment. Scan1, Scan2 and Scan3 represent a voltage pulse applied to a selection line 138, Transfer represents a voltage pulse applied to a transmission signal line 140, Data1-Data4 represents a data signal of a data line 131, Second electrode1 represents a voltage of a second electrode 130a and Second electrode2 represents a voltage of a second electrode 130b.

One frame is divided into a first half first field and second half second field.

Signals Scan1, Scan2 are applied to a selection line 138 on each row in the first field, and a selection voltage (High Level) is supplied in sequence to a gate electrode of the selection transistor 120 one row at a time. Scan1 which is applied to the selection line 138 on the first row becomes selection voltage in a time t1 period, and a data signal (Data1-4) of the data line 131 is transmitted to a first stage storage capacitor CH1 of the pixel circuit 109. The second row is selected in a time period t2, and the third row is selected in a time period t3, the same operations are repeated in sequence, and a data signal is written to a pixel circuit 109 on all rows.

Next, a signal Transfer of a transmission signal line 140 on all rows become a High Level at once in the time period t11, and the transmission transistor 122 of the drive circuit 118 becomes an ON state. In this way, the voltage of the first stage storage capacitor CH1 is transmitted to a second stage storage capacitor CH2. The voltage stored in the second stage storage capacitor CH2 continues to be applied to the gate of the drive transistor 124 even after a transmission signal line returns to a Low Level.

A light ON voltage V1 is applied to a first common power supply line 134a (Second electrode1) and a light OFF V2 is applied to a second common power supply line 134b (Second electrode2) in the second field after the time period t11 is completed. A light emitting element with the second electrode 130a connected to the first common power supply line 134a (Second electrode1) becomes a reverse direction bias state, a current does not flow and light is not emitted. A light emitting element of the second electrode 130b connected to the second common power supply line 134b (Second electrode2) becomes a forward direction bias state, a current flows and light is emitted. Therefore, during the light emitting period in the second field, only one among the two light emitting elements in each sub-pixel is in a light ON state and the other light emitting element is in a light OFF state.

In the second field, Scan1 and Scan2 play a role of a selection voltage in time period t4 and t5 respectively, lower rows similarly become a selection voltage in sequence and the same writing operation is performed. Next, the transmission signal line 140 becomes a selection voltage (High Level) in the time period t12 and a data signal is transferred to a gate of the drive transistor 124.

In the first field of the next frame after the time period t12 is completed, a light ON voltage V2 is applied to the first common power supply line 134a and a light OFF voltage V1 is applied to the second common power supply line 134b. In this way, a light emitting element which was not in a light ON state during the light emitting time period of the second field in each sub-pixel becomes a light ON state and the light emitting element which was in a light ON state in the second field becomes a light OFF state.

Displaying one frame image is completed in the two fields and a color image averaged in the two fields is visually observed.

Third Embodiment

Figure 12:
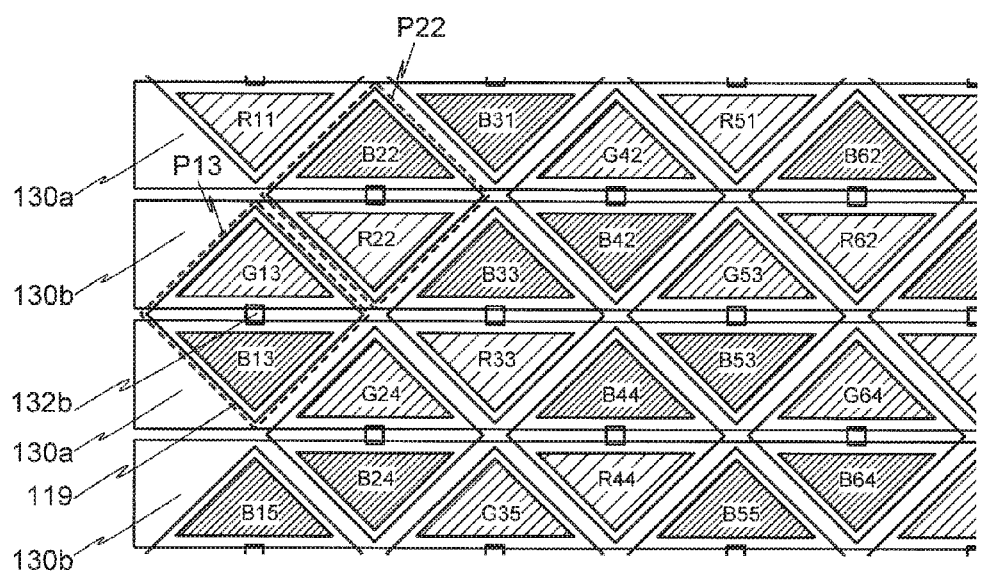
FIG. 12 is an upper surface diagram for explaining a layout of a pixel in a display device related to one embodiment of the present invention.

A structure and driving method of a display device 300 related to the present embodiment is explained using the diagrams. FIG. 12 is an upper surface view diagram for explaining a layout of pixels in the display device 300 related to the present embodiment. Furthermore, the structure of a pixel circuit 109 in the display device 300 related to the present embodiment is the same as the display device 100 related to the first embodiment shown in FIG. 2.

When the display device 300 related to the present embodiment is compared with the display device 100 related to the first embodiment, the layout of the pixels P and second electrode 130 is different. In particular, the layout of the second electrode 130 is simplified and thereby separation of the second electrodes in a manufacturing process becomes easy.

FIG. 12 is an upper surface view diagram for explaining a layout of pixels in the display device 300 related to the present embodiment. In FIG. 12, numbers are attached to rows and columns in pixel units, Pij is attached to a pixel on row i and column j, and a symbol such as Rij is attached to a sub-pixel which forms the pixel Pij. A red sub-pixel is indicated by the symbols R11, R22, R33, R44 . . . , R51, R62 . . . A green sub-pixel is indicated by the symbols G13, G24, G35 . . . , G42, G53, G64 . . . . A blue sub-pixel is arranged within all pixels P, and are indicated by the symbols . . . B13, B15, . . . B22, B24, . . . B31, B33, . . . B42, B44, . . . , B53, B55, . . . , B62, B64, . . . .

In this example, a pixel P22 is formed by a blue sub-pixel B22 and red sub-pixel R22. A pixel P13 adjacent to the pixel P22 is formed by a green sub-pixel G13 and a blue sub-pixel B13. That is, in a pixel P13 in FIG. 2, the light emitting element 126a forms a green sub-pixel G13 and the light emitting element 126b forms a blue sub-pixel B13. Pixels including the same structure are arranged in a right downward sloping direction. Two pixels the same as pixel P22 and pixel P13 are arranged alternately in a right upwards sloping direction.

Among two sub-pixels within a pixel P, the second electrode of a light emitting element which forms a lower side sub-pixel is connected to a second electrode of a light emitting element which forms an upper side sub-pixel among the sub-pixels within a pixel adjacent to the lower left. In this example, the second electrode of a light emitting element which forms a red sub-pixel R22 in the pixel P22 and the second electrode of a light emitting element which forms a green sub-pixel G13 in the pixel P13 adjacent to the lower left are connected.

Second electrodes common to a plurality of light emitting elements have periodicity in a vertical direction and form the second electrodes 130a and 130b.

The second electrodes 130a and 130b extend to the outside of the display region 106 and are connected to every other common power supply line 134a and 134b via a contact hole 132a. The display device 300 related to the present embodiment includes two common power supply lines and a light ON voltage V1 and light OFF voltage V2 are switched and selectively supplied from two second electrodes (not shown in the diagram) of the common power supply lines respectively.

A driving method of the display device 300 related to the present embodiment is explained using FIG. 13. FIG. 13 is a timing chart for explaining a driving method of the display device 300 related to the present embodiment. Scan1, Scan2 and Scan3 represent a voltage pulse applied to a selection line 138, Transfer represents a voltage pulse applied to a transmission signal line 140, Data1-Data4 represents a data signal of a data line 131, Second electrode1 represents a voltage of a second electrode 130a and Second electrode2 represents a voltage of a second electrode 130b.

One frame is divided in to a first half first field and second half second field.

Signals Scan1, Scan2 are applied to a selection line 138 on each row in the first field, and a selection voltage (High Level) is supplied in sequence to a gate electrode of the selection transistor 120 one row at a time. Scan1 which is applied to the selection line 138 on the first row becomes selection voltage in a time t1 period, and a data signal (Data1-4) of the data line 131 is transmitted to a first stage storage capacitor CH1 of the pixel circuit 109. The second row is selected in a time period t2, and the third row is selected in a time period t3, the same operations are repeated in sequence, and a data signal is written to a pixel circuit 109 on all rows.

Next, a signal Transfer of a transmission signal line 140 on all rows become a High Level at once in the time period t11, and the transmission transistor 122 of the drive circuit 118 becomes an ON state. In this way, the voltage of the first stage storage capacitor CH1 is transmitted to a second stage storage capacitor CH2. The voltage stored in the second stage storage capacitor CH2 continues to be applied to the gate of the drive transistor 124 even after a transmission signal line returns to a Low Level.

A light ON voltage V1 is applied to a first common power supply line 134a (Second electrode1) and a light OFF V2 is applied to a second common power supply line 134b (Second electrode2) in the second field after the time period t11 is completed. A light emitting element with the Second electrode 130a connected to the first common power supply line 134a (Second electrode1) becomes a reverse direction bias state, a current does not flow and light is not emitted. A light emitting element above the second electrode 130b connected to the second common power supply line 134b (Second electrode2) becomes a forward direction bias stete, a current flows and light is emitted. Therefore, during the light emitting period in the second field, only one among the two light emitting elements in each sub-pixel is in a light ON state and the other light emitting element is in a light OFF state.

In the second field, Scan1 and Scan2 play a role of a selection voltage in time period t4 and t5 respectively, lower rows similarly become a selection voltage in sequence and the same writing operation is performed. Next, the transmission signal line 140 becomes a selection voltage (High Level) in the time period t12 and a data signal is transferred to a gate of the drive transistor 124.

In the first field of the next frame after the time period t12 is completed, a light ON voltage V2 is applied to the first common power supply line 134a and a light OFF voltage V1 is applied to the second common power supply line 134b. In this way, a light emitting element which was not in a light ON state during the light emitting time period of the second field in each sub-pixel becomes a light ON state and the light emitting element which was in a light ON state in the second field becomes a light OFF state.

Displaying one frame image is completed in the two fields and a color image averaged in the two fields is visually observed.

The display devices 100 to 300 related to the preferred embodiments of the present invention were explained above. However, the display devices are merely examples and the technical scope of the present invention is not limited to these examples. Therefore, various modifications are possible without departing from the scope of the present invention claimed in the scope of the patent claims. Therefore, such modifications similarly belong to the technical scope of the present invention.

What is claimed is:

1. A display device comprising:
a substrate having a display region;
a plurality of pixels arranged in the display region, each of the plurality of pixels having n (n is an integer of 2 or more) number of light emitting elements, each of the n number of light emitting elements being stacked with a first electrode, a light emitting layer and a second electrode in order from the substrate side, the first electrode being provided in each of the plurality of pixels and in common with the n number of light emitting elements provided in each of the plurality of pixels;
a bank arranged between adjacent pixels and between the adjacent light emitting elements, having a recess part electrically separating the second electrode into n number of second electrodes; and
a first sealing layer covering the light emitting layer and the bank,
wherein,
each of the n number of second electrodes is provided in any one of the n number of the light emitting elements in each of the plurality of pixels, and
the first sealing layer is in contact with an entire upper surface of the bank in the recess part.

2. The display device according to claim 1 further comprising:
an organic insulation layer arranged in the recess part and above the first sealing layer, the organic insulation layer planarizing a top part of the bank; and
a second sealing layer covering the first sealing layer and the organic insulation layer.

3. The display device according to claim 2, wherein the organic insulation layer is an acrylic resin.

4. The display device according to claim 1, wherein the bank has a layer structure including a stopper layer and an organic insulation layer above the stopper layer.

5. The display device according to claim 4, wherein the stopper layer includes an inorganic insulation layer.

* * * * *